United States Patent
Chun et al.

(10) Patent No.: US 9,412,429 B2
(45) Date of Patent: Aug. 9, 2016

(54) MEMORY DEVICE WITH MULTIPLE VOLTAGE GENERATORS

(71) Applicant: SAMSUNG ELECTRONICS CO., LTD., Suwon-Si, Gyeonggi-Do (KR)

(72) Inventors: Ki-Chul Chun, Seongnam-si (KR); Chul-Sung Park, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/571,418

(22) Filed: Dec. 16, 2014

(65) Prior Publication Data
US 2015/0187402 A1 Jul. 2, 2015

(30) Foreign Application Priority Data

Dec. 27, 2013 (KR) ........................ 10-2013-0165884

(51) Int. Cl.
| | | |
|---|---|---|
| *G11C 5/14* | (2006.01) | |
| *G11C 8/08* | (2006.01) | |
| *G11C 8/10* | (2006.01) | |
| *G11C 8/12* | (2006.01) | |
| *G11C 11/4074* | (2006.01) | |
| *G11C 11/4091* | (2006.01) | |
| *G11C 11/408* | (2006.01) | |

(52) U.S. Cl.
CPC ........ *G11C 8/08* (2013.01); *G11C 5/147* (2013.01); *G11C 8/10* (2013.01); *G11C 8/12* (2013.01); *G11C 11/4074* (2013.01); *G11C 11/4085* (2013.01); *G11C 11/4091* (2013.01)

(58) Field of Classification Search
CPC .............. G11C 8/08; G11C 8/10; G11C 8/12; G11C 5/147
USPC ................................................ 365/226, 227
See application file for complete search history.

(56) References Cited

U.S. PATENT DOCUMENTS

| | | | | | |
|---|---|---|---|---|---|
| 5,554,953 | A | * | 9/1996 | Shibayama | G05F 1/465 323/315 |
| 5,568,440 | A | * | 10/1996 | Tsukude | G11C 5/147 365/189.09 |
| 5,689,460 | A | * | 11/1997 | Ooishi | G11C 5/143 327/530 |
| 5,747,974 | A | * | 5/1998 | Jeon | G05F 1/465 323/269 |
| 5,917,765 | A | * | 6/1999 | Morishita | G11C 5/147 365/201 |
| 5,973,548 | A | * | 10/1999 | Ukita | G05F 1/465 327/540 |
| 6,005,436 | A | * | 12/1999 | Shibayama | G05F 1/465 327/545 |
| 6,219,293 | B1 | * | 4/2001 | Butler | G11C 11/4074 365/189.09 |
| 6,339,357 | B1 | * | 1/2002 | Yamasaki | G11C 5/147 327/407 |
| 6,384,672 | B2 | * | 5/2002 | Oh | 323/267 |
| 6,418,075 | B2 | * | 7/2002 | Shimano | G11C 5/14 327/534 |

(Continued)

FOREIGN PATENT DOCUMENTS

| | | |
|---|---|---|
| KR | 20070007514 A | 1/2007 |
| KR | 20090092184 A | 8/2009 |

*Primary Examiner* — Viet Q Nguyen
(74) *Attorney, Agent, or Firm* — Volentine & Whitt, PLLC

(57) ABSTRACT

A semiconductor memory device includes multiple voltage generators. The memory device includes a first voltage generator for generating a first internal voltage based on a first power supply voltage, and a second voltage generator for generating a second internal voltage based on a second power supply voltage that is lower than the first power supply voltage. The first internal voltage is used as a driving voltage of a bit line sense amplifier in a core block including a memory cell array. The second internal voltage that is lower than the first internal voltage is used as a driving voltage of a peripheral circuit block other than the core block.

20 Claims, 10 Drawing Sheets

(56) References Cited

U.S. PATENT DOCUMENTS

| | | | |
|---|---|---|---|
| 6,768,689 B2 | 7/2004 | Origasa | |
| 6,781,915 B2 * | 8/2004 | Arimoto | G11C 7/18 257/E27.084 |
| 6,958,947 B2 * | 10/2005 | Park | G11C 5/147 365/156 |
| 7,161,387 B2 * | 1/2007 | Yamasaki | H03K 3/356113 326/80 |
| 7,339,847 B2 | 3/2008 | Kim et al. | |
| 7,548,482 B2 * | 6/2009 | Yang | G11C 5/14 365/189.04 |
| 7,558,128 B2 * | 7/2009 | Shin | G11C 5/147 365/189.09 |
| 7,652,944 B2 * | 1/2010 | Iwaya | G11C 5/005 307/65 |
| 7,936,615 B2 * | 5/2011 | Sunwoo | G11C 5/147 365/149 |
| 7,936,632 B2 * | 5/2011 | Kang | G11C 11/4074 327/530 |
| 8,036,048 B2 * | 10/2011 | Takahashi | G11C 8/08 365/149 |
| 8,149,642 B2 * | 4/2012 | Kim | G11C 5/144 365/226 |
| 8,149,644 B2 | 4/2012 | Fujioka et al. | |
| 8,194,456 B2 * | 6/2012 | Kim | G11C 5/14 365/185.18 |
| 8,749,299 B2 * | 6/2014 | Han | G05F 1/465 327/536 |
| 9,053,814 B2 * | 6/2015 | Lee | G05F 1/56 |
| 9,148,056 B2 * | 9/2015 | Zanetta | H02M 3/158 |
| 2007/0247931 A1 * | 10/2007 | Kim | G11C 5/147 365/189.09 |
| 2008/0042730 A1 | 2/2008 | Kang | |
| 2011/0090754 A1 | 4/2011 | Kim et al. | |
| 2011/0194358 A1 | 8/2011 | Choi | |
| 2012/0023345 A1 | 1/2012 | Naffziger et al. | |

* cited by examiner

MEMORY DEVICE WITH MULTIPLE VOLTAGE GENERATORS

CROSS-REFERENCE TO RELATED APPLICATIONS

A claim of priority is made to Korean Patent Application No. 10-2013-0165884, filed on Dec. 27, 2013, in the Korean Intellectual Property Office, the disclosure of which is incorporated herein in its entirety by reference.

BACKGROUND

The inventive concept relates to a semiconductor memory device, and more particularly, to a semiconductor memory device which includes multiple voltage generators.

In order to reduce power consumption, an operating environment of a semiconductor memory device is trending towards utilization of relatively low operating voltages.

The semiconductor memory device may be designed to be driven by an internal voltage that is voltage-dropped from an external power supply voltage. To achieve a desired low power-consumption, the level of an external power supply voltage, which is an operating voltage, may be lowered. The level of the internal voltage is also lowered due to the lowered level of the external power supply voltage. If the level of the internal voltage is lowered under a target voltage, the operating characteristics of the semiconductor memory device may be deteriorated.

SUMMARY

According to an aspect of the inventive concept, there is provided a memory device including a first voltage generator configured to generate a first internal voltage based on a first power supply voltage, and a second voltage generator configured to generate a second internal voltage based on a second power supply voltage that is lower than the first power supply voltage. The first internal voltage is used as a driving voltage of a bit line sense amplifier in a core block including a memory cell array, and the second internal voltage that is lower than the first internal voltage is used as a driving voltage of a peripheral circuit block other than the core block.

The first internal voltage may be used as a cell plate voltage of the memory cell array or a source voltage of a bit line precharge voltage.

The first internal voltage may be used as a transistor gating voltage of a column selection circuit that selects a bit line of the memory cell array.

The second internal voltage may be used as an operating voltage of data input and output buffers of a pad block of the memory device.

The second internal voltage may be used as an operating voltage of a control logic, a row address multiplexer, a column address latch, an input and output gating circuit, and a refresh address generator, which constitute the peripheral circuit block.

The memory device may further include a third voltage generator configured to generate a boosted voltage for driving a word line of the memory cell array based on the first power supply voltage. The boosted voltage is higher than the first power supply voltage.

The memory device may further include a fourth voltage generator configured to generate a back bias voltage, which is used as a body bias of a cell transistor of the memory cell array, based on the second power supply voltage. The back bias voltage has a negative voltage level.

The back bias voltage may be used as a gate bias of the cell transistor during a standby operation of the memory device.

According to an aspect of the inventive concept, there is provided a memory device including a first voltage generator configured to generate a first internal voltage, which is higher than a first power supply voltage, based on the first power supply voltage, a second voltage generator configured to generate a second internal voltage, which is lower than a second power supply voltage, based on the second power supply voltage that is lower than the first power supply voltage, and a third voltage generator configured to generate a third internal voltage, which is lower than the second internal voltage, based on a third power supply voltage that is lower than the second power supply voltage. The first internal voltage is used as a boosted voltage for driving a word line of a memory cell array, the second internal voltage is used as a driving voltage of a bit line sense amplifier in a core block including the memory cell array, and the third internal voltage is used as a driving voltage of a peripheral circuit block other than the core block.

BRIEF DESCRIPTION OF THE DRAWINGS

Exemplary embodiments of the inventive concept will become more readily understood from the detailed description that follows, taken in conjunction with the accompanying drawings, in which.

DETAILED DESCRIPTION OF THE EMBODIMENTS

Figure 1:
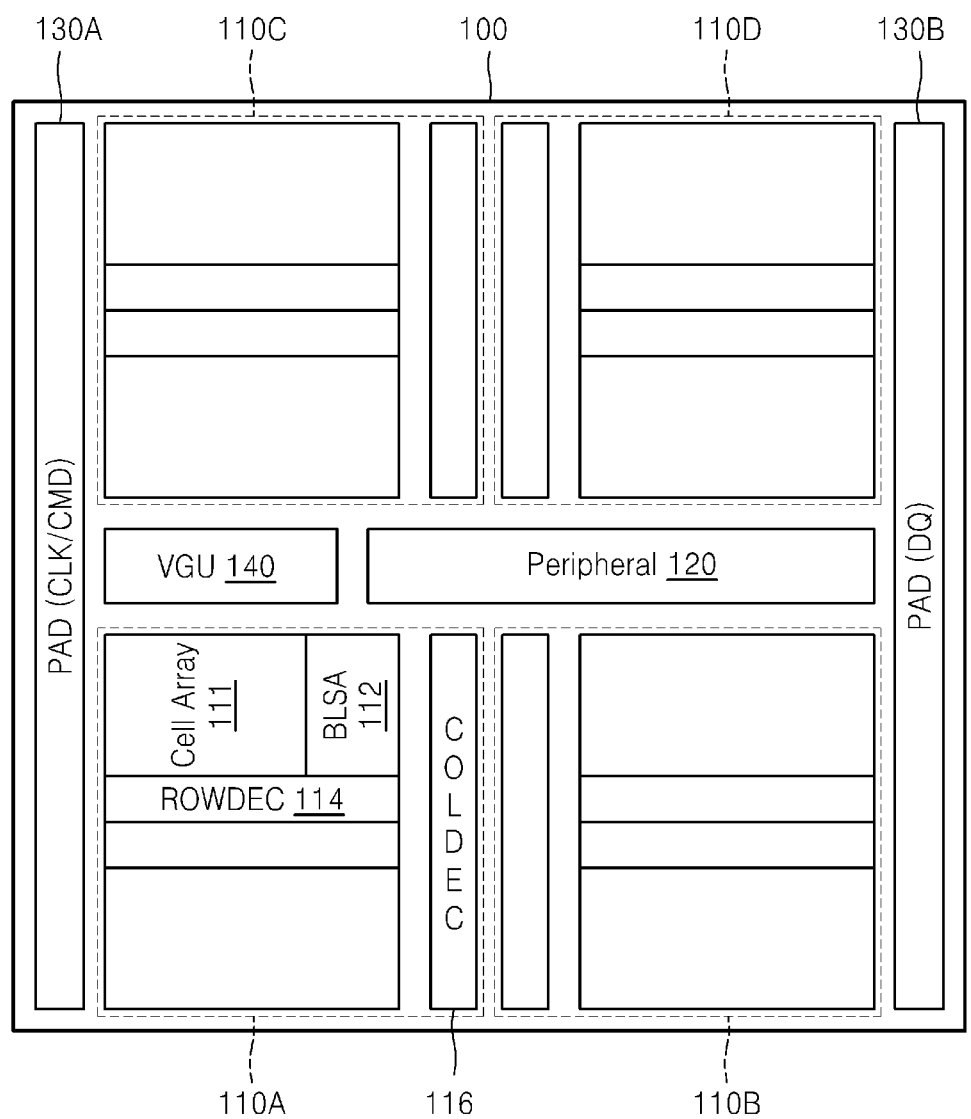
FIG. 1 is a diagram of a memory device that is driven by voltage generators, according to an embodiment of the inventive concept.

Hereinafter, the inventive concept will be described more fully with reference to the accompanying drawings, in which exemplary embodiments of the inventive concept are shown. The inventive concept may, however, be embodied in many different forms and should not be construed as being limited to the embodiments set forth herein. Rather, these embodiments are provided so that this disclosure will be thorough and complete, and will fully convey the inventive concept to those skilled in the art. As the inventive concept allows for various changes and numerous embodiments, particular embodiments will be illustrated in the drawings and described in detail in the written description. However, this is not intended to limit the inventive concept to particular modes of practice, and it is to be appreciated that all changes, equivalents, and substitutes that do not depart from the spirit and technical scope of the inventive concept are encompassed in the inventive concept. Throughout the written description and drawings, like reference numbers and labels refer to like or similar elements.

The terminology used herein is for the purpose of describing particular embodiments only and is not intended to be limiting of exemplary embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, components, or combinations thereof but do not preclude the presence or addition of one or more other features, integers, steps, operations, elements, components, or combinations thereof.

Unless otherwise defined, all terms (including technical and scientific terms) used herein have the same meaning as commonly understood by one of ordinary skill in the art to which exemplary embodiments belong. Also, as is traditional in the field of the inventive concept, embodiments may be described in terms of function blocks, units and/or modules. It will be understood that these blocks, units and/or modules are physically implemented by electronics circuits, and that such circuits may be operate under hardware control, software control, or a combination thereof. It will be further understood that terms, such as those defined in commonly used dictionaries, should be interpreted as having a meaning that is consistent with their meaning in the context of the relevant art and will not be interpreted in an idealized or overly formal sense unless expressly so defined herein. As used herein, the term "and/or" includes any and all combinations of one or more of the associated listed items. Expressions such as "at least one of" when preceding a list of elements, modify the entire list of elements and do not modify the individual elements of the list.

A semiconductor memory device may include a voltage generator which generates an internal power supply voltage from an external power supply voltage. When the semiconductor memory device is implemented as a dynamic random access memory (DRAM), the internal power supply voltage may be used as a power supply voltage of a core block which includes a DRAM cell array.

Among operating characteristics of the DRAM, a refresh time may be proportional to the amount of charge stored in a cell node. The cell node refers to a node between a DRAM cell transistor and a cell capacitor. The amount of charge stored in the cell node, Q, is proportional to a cell capacitance C based on Q=CV, and is proportional to an internal voltage which is a stored voltage V. As the size of a cell capacitor decreases due to segmentation of a semiconductor manufacturing process, the cell capacitance C also decreases. In such circumstances where the cell capacitance C decreases, to secure a refresh time, the level of the internal power supply voltage needs to be high. That is, the refresh time may be guaranteed only when the internal power supply voltage is maintained constant at a target voltage level.

In the DRAM, a bit line sense amplifier for sensing memory cell data may be formed by using a bit line sense amplifier of a cross-coupled latch type. In order to secure a stable operation of the bit line sense amplifier, an internal power supply voltage for driving the bit line sense amplifier also has to be maintained constant at a target voltage level.

The internal power supply voltage is typically generated by being voltage-dropped from the external power supply voltage. With the low-power consumption trend of the DRAM, the level of the external power supply voltage is lowered. The level of the internal power supply voltage may also be lowered due to the lowered level of the external power supply voltage. In this case, the internal power supply voltage may be generated to have a level that is lower than the target voltage level, depending on the lowered external power supply voltage. Because of the internal power supply voltage having a level that is lower than the target voltage level, the refresh time of the DRAM may be difficult to secure or a bit line sense amplifier of the DRAM may not satisfactorily operate. Accordingly, voltage generators, which may maintain a constant target voltage level of the internal power supply voltage even if the level of the external power supply voltage is lowered, are required.

FIG. 1 is a diagram of a memory device 100 that is driven by voltage generators, according to an embodiment of the inventive concept.

Referring to FIG. 1, the memory device 100 includes core blocks 110A to 110D, a peripheral circuit block 120, pad blocks 130A and 130B, and a voltage generation circuit block 140. Each of the core blocks 110A to 110D includes a memory cell array 111. A peripheral circuit block 120 includes logic circuits. Each of the pad blocks 130A and 130B includes pads. The memory device 100 may include a plurality of core blocks, and in the current embodiment, a case in which the memory device 100 includes four core blocks 110A to 110D is described.

Each of the core blocks 110A to 110D may include the memory cell array 111 including a plurality of memory cells, a bit line sense amplifier 112, a row decoder 114, and a column decoder 116. The memory cell array 111 may constitute a memory bank. The bit line sense amplifier 112 may sense memory cell data in the memory cell array 111 and may amplify the sensed memory cell data. That is, the bit line sense amplifier 112 may amplify a voltage difference between a bit line and a complementary bit line, which are connected to a memory cell, and may provide the amplified voltage difference to the peripheral circuit block 120.

The row decoder 114 decodes a row address and activates a word line by using the decoded row address. Data stored in memory cells of the activated word line is sensed and amplified by the bit line sense amplifier 112. The column decoder 116 decodes a column address and accesses memory cells corresponding to the decoded column address from among the memory cells of the activated word line in the memory cell array 111.

The peripheral circuit block 120 may include a control logic, a row address multiplexer, a column address latch, an input and output gating circuit, and a refresh address generator.

The control logic may control an operation of the memory device 100. Also, the control logic may generate control signals so that the memory device 100 may perform a write operation or a read operation. The control logic may include a command decoder for decoding a command that is received from a memory controller, and a mode register for setting an operation mode of the memory device 100. The command decoder may decode a write enable signal /WE, a row address strobe signal /RAS, a column address strobe signal /CAS, a chip selection signal /CS, and the like to generate control signals corresponding to the command.

The control logic may further receive a clock signal CLK for synchronously driving the memory device 100 and a clock enable signal CKE. The control logic may control the refresh address generator so that an automatic refresh operation is performed in response to a refresh command REF or may control the refresh address generator so that a self-refresh operation is performed in response to a self-refresh entry command SRE.

An address buffer may receive addresses including a row address and a column address from the memory controller. In addition, when the memory cell array 111 includes a plurality of bank arrays, the address buffer may further receive a bank address. The address buffer may provide a received row address to the row address multiplexer, may provide a received column address to the column address latch, and may provide a received bank address to a bank control logic.

The bank control logic may generate bank control signals in response to the bank address. The row decoder 114 and the column decoder 116, which are connected to a bank corresponding to the bank address, may be activated in response to the bank control signals.

The row address multiplexer may receive the row address from the address buffer and may receive a refresh row address from the refresh address generator. The row address multiplexer may selectively output the row address or the refresh row address. The row address output from the row address multiplexer may be applied to the row decoder 114.

The column address latch may receive the column address from the address buffer and may temporarily store the received column address. The column address latch may gradually increase the received column address in a burst mode. The column address latch may apply a temporarily stored or gradually increased column address to the column decoder.

The input and output gating circuit may include an input data mask logic, a read data latch for storing data output from the memory cell array 111, and a write driver for writing data to the memory cell array 111 as well as circuits for gating input and output data.

The data read from the memory cell array 111 may be sensed and amplified by the bit line sense amplifier 112, and the amplified data may be stored in the read data latch. Data stored in the read data latch may be provided to a data input and output pad DQ through a data input and output buffer. Data to be written into the memory cell array 111 may be provided to the data input and output buffer through the data input and output pad DQ. The data provided to the data input and output buffer may be written into the memory cell array 111 through the write driver.

Pads, which receive the write enable signal /WE, the row address strobe signal /RAS, the column address strobe signal /CAS, the chip selection signal /CS, the clock signal CLK, the clock enable signal CKE and address signals, may be arranged in the pad block 130A. In addition, input buffers and address buffers, which are connected to pads corresponding to the input buffers and address buffers, may be arranged in the pad block 130A. In some embodiments, pads that are shared by a command signal and an address signal may be arranged in the pad block 130A. In this case, the pad block 130A may include command address buffers that receive command and address signals and that distinguish a command signal and an address signal to latch them. The pad block 130B may include data input and output pads DQs and data input and output buffers that are connected to the data input and output pads DQs, respectively.

The voltage generation circuit block 140 may include a plurality of voltage generators that drive the memory device 100. The voltage generation circuit block 140 may include a first voltage generator for generating a first internal power supply voltage based on a first external power supply voltage, and a second voltage generator for generating a second internal power supply voltage, which is lower than the first internal power supply voltage, based on a second external power supply voltage which is lower than the first external power supply voltage. In some embodiments, the voltage generation circuit block 140 may include a first voltage generator for generating a first internal power supply voltage, which is higher than a first power supply voltage, based on the first power supply voltage, a second voltage generator for generating a second internal power supply voltage, which is lower than a second power supply voltage, based on the second power supply voltage which is lower than the first power supply voltage, and a third voltage generator for generating a third internal power supply voltage, which is lower than the second internal power supply voltage, based on a third power supply voltage which is lower than the second power supply voltage.

Figure 2:
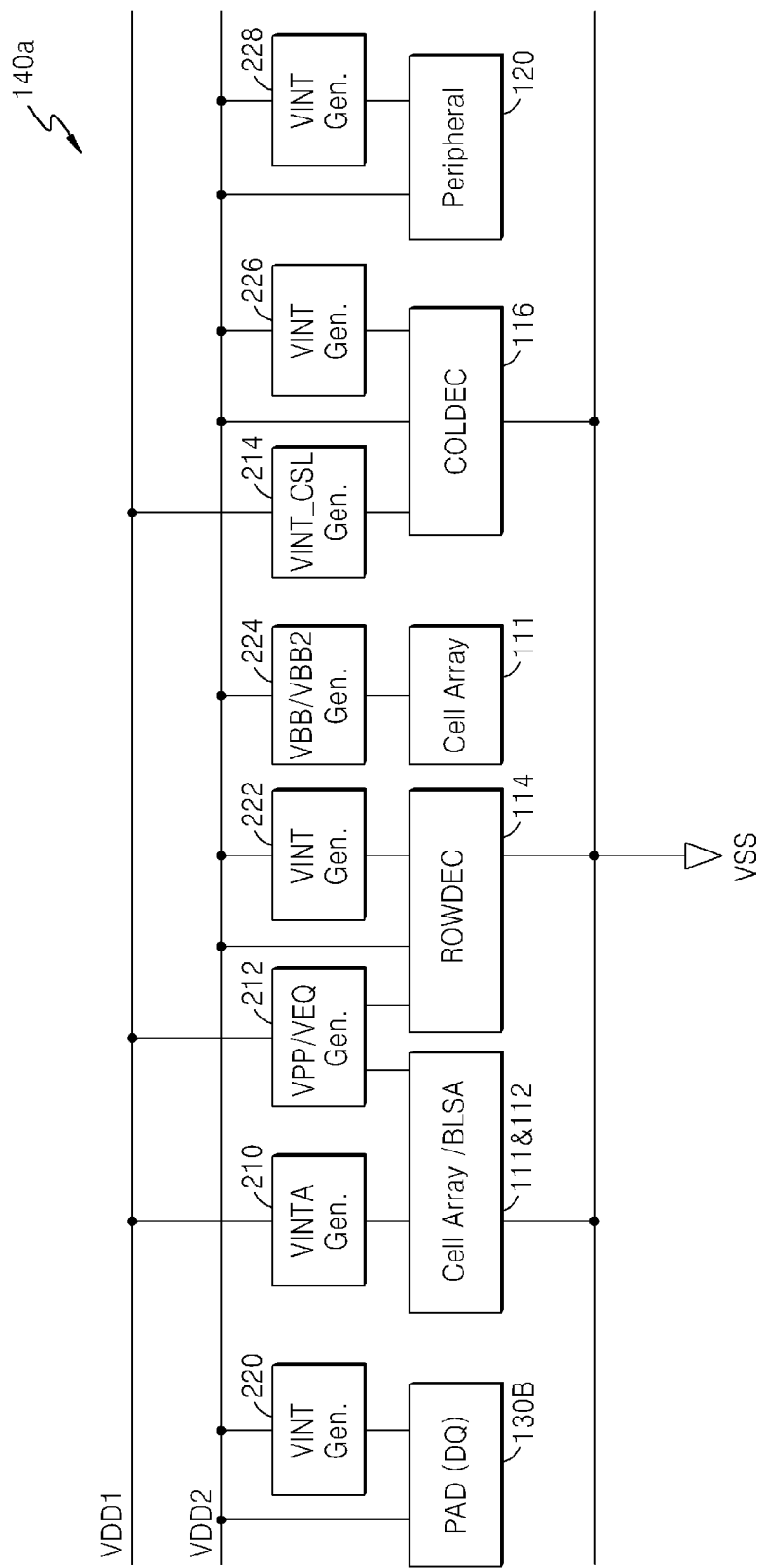
FIG. 2 is a diagram illustrating a plurality of voltage generators included in a voltage generation circuit block of FIG. 1, according to an embodiment of the inventive concept.

FIG. 2 is a diagram illustrating a plurality of voltage generators included in a voltage generation circuit block 140a as an example of the voltage generation circuit block 140 of FIG. 1, according to an embodiment of the inventive concept.

Referring to FIG. 2, the voltage generation circuit block 140a may be driven by a first external power supply voltage VDD1, a second external power supply voltage VDD2, and a ground voltage VSS. The first external power supply voltage VDD1 may be set to have a voltage level that is higher than the second external power supply voltage VDD2. The voltage generation circuit block 140a may include first to third voltage generators 210, 212, and 214 and fourth to eighth voltage generators 220, 222, 224, 226, and 228.

The first external power supply voltage VDD1 may be applied to the first voltage generator 210, the second voltage generator 212, and the third voltage generator 214. The second external power supply voltage VDD2 may be applied to the fourth voltage generator 220, the fifth voltage generator 222, the sixth voltage generator 224, the seventh voltage generator 226, and the eighth voltage generator 228.

The first and third voltage generators 210 and 214 may generate first and third internal power supply voltages VINTA and VINT_CSL, respectively, which are dropped from the first external power supply voltage VDD1. The first internal power supply voltage VINTA may be provided to the memory cell array 111 and the bit line sense amplifier 112. The first internal power supply voltage VINTA may be used as a driving voltage of the bit line sense amplifier 112, or may be used as a cell plate voltage VCP of the memory cell array 111 or a source voltage of a bit line precharge voltage VBL. The third internal power supply voltage VINT_CSL may be provided to the column decoder 116 and may be used as a transistor gating voltage of a column selection circuit, which selects a bit line of the memory cell array 111, to stably secure the transmission of read data output from the bit line sense amplifier 112 and the transmission of write data to the memory cell array 111. The voltage level of the first internal power supply voltage VINTA and the voltage level of the third internal power supply voltage VINT_CSL may be the same as each other or different from each other.

The second voltage generator 212 may perform a charge pumping operation based on the first external power supply voltage VDD1, and thus may generate a second internal power supply voltage VPP that is higher than the first external power supply voltage VDD1. The second internal power supply voltage VPP may be referred to as a high voltage VPP that is a boosted voltage. The high voltage VPP may be provided to the row decoder 114 and may be used as a word line driving voltage of the memory cell array 111.

In addition, the second voltage generator 212 may generate a second internal power supply voltage VEQ dropped from the first external power supply voltage VDD1. The second internal power supply voltage VEQ may be referred to as an equalizing voltage VEQ. The equalizing voltage VEQ may be used as a driving voltage of an equalization control signal PEQi for equalizing a bit line of the memory cell array 111 and a complementary bit line thereof with a bit line precharge voltage VBL before a sensing operation of the bit line sense amplifier 112. The equalizing voltage VEQ may have a voltage level between the first external power supply voltage VDD1 and the second external power supply voltage VDD2.

The fourth to eighth voltage generators 220, 222, 224, 226, and 228 may generate internal power supply voltages VINT and VBB/VBB2 dropped from the second power supply voltage VDD2. The internal power supply voltage VINT generated from the fourth voltage generator 220 may be provided to the pad block 130B and may be used as an operating voltage of the data input and output buffers of the pad block 130B. The data input and output buffers may use the internal power supply voltage VINT and/or the second external power supply voltage VDD2 as the operating voltage.

The internal power supply voltage VINT generated from the fifth voltage generator 222 may be provided to the row decoder 114 and may be used as an operating voltage of the row decoder 114. The row decoder 114 may use the internal power supply voltage VINT and/or the second external power supply voltage VDD2 as the operating voltage of the row decoder 114.

The internal power supply voltage VBB/VBB2 generated from the sixth voltage generator 224 may have a negative voltage level and may be referred to as a back bias voltage VBB or VBB2. The back bias voltage VBB may be provided to the memory cell array 111, and thus may be used as a body bias of a cell transistor to prevent a leakage current of the cell transistor. The back bias voltage VBB2 may be used as a gate bias of the cell transistor during a standby operation of the memory device 100.

The internal power supply voltage VINT generated from the seventh voltage generator 226 may be provided to the column decoder 116 and may be used as an operating voltage of the column decoder 116. The column decoder 116 may use the internal power supply voltage VINT and/or the second external power supply voltage VDD2 as the operating voltage of the column decoder 116.

The internal power supply voltage VINT generated from the eighth voltage generator 228 may be provided to the peripheral circuit block 120 and may be used as an operating voltage of the peripheral circuit block 120. The control logic, the row address multiplexer, the column address latch, the input and output gating circuit, and the refresh address generator, which constitute the peripheral circuit block 120, may use the internal power supply voltage VINT and/or the second external power supply voltage VDD2 as the operating voltage thereof.

The internal power supply voltages VINT generated from the fourth, fifth, seventh, and eighth voltage generators 220, 222, 226, and 228 may have the same voltage level. In some embodiments, the internal power supply voltages VINT generated from the fourth, fifth, seventh, and eighth voltage generators 220, 222, 226, and 228 may have different voltage levels.

With the low-power consumption trend of the memory device 100, the first and second external power supply voltages VDD1 and VDD2 may be lowered. Although the first and second external power supply voltages VDD1 and VDD2 are lowered, the bit line sense amplifier 112 may be driven according to the first internal power supply voltage VINTA that is generated based on the first external power supply voltage VDD1 that is higher than the second external power supply voltage VDD2. Accordingly, the bit line sense amplifier 112 may perform a stable operation. In addition, since the first internal power supply voltage VINTA is used as the cell plate voltage of the memory cell array 111 or the source voltage of the bit line precharge voltage VBL, a refresh time may be secured.

Figure 3:
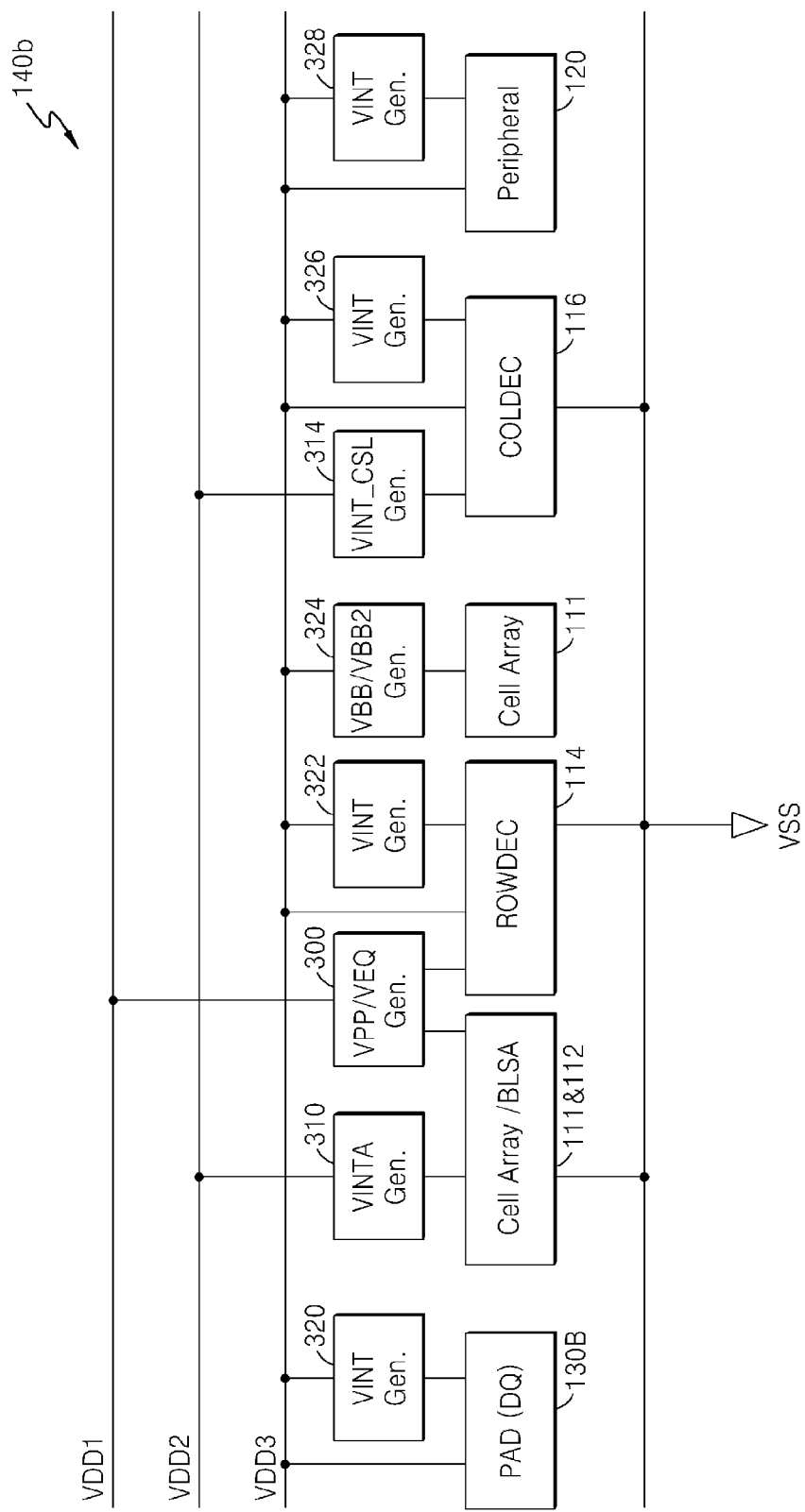
FIG. 3 is a diagram illustrating a plurality of voltage generators included in a voltage generation circuit block of FIG. 1, according to another embodiment of the inventive concept.

FIG. 3 is a diagram illustrating a plurality of voltage generators included in a voltage generation circuit block 140b as an example of the voltage generation circuit block 140 of FIG. 1, according to another embodiment of the inventive concept.

Referring to FIG. 3, the voltage generation circuit block 140b may be driven by a first external power supply voltage VDD1, a second external power supply voltage VDD2, a third external power supply voltage VDD3, and a ground voltage VSS. The first external power supply voltage VDD1 may be set to have a voltage level that is higher than the second external power supply voltage VDD2, and the second external power supply voltage VDD2 may be set to have a voltage level that is higher than the third external power supply voltage VDD3. That is, the level of the first external power supply voltage VDD1 may be set to be the highest voltage level, and the third external power supply voltage VDD3 may be set to be the lowest voltage level. The voltage generation circuit block 140b may include a first voltage generator 300, second and third voltage generators 310 and 314, and fourth to eighth voltage generators 320, 322, 324, 326, and 328.

The first external power supply voltage VDD1 may be applied to the first voltage generator 300. The second external power supply voltage VDD2 may be applied to the second voltage generator 310 and the third voltage generator 314. The third external power supply voltage VDD3 may be applied to the fourth voltage generator 320, the fifth voltage generator 322, the sixth voltage generator 324, the seventh voltage generator 326, and the eighth voltage generator 328.

The first voltage generator 300 may perform a charge pumping operation based on the first external power supply voltage VDD1, and thus may generate a first internal power supply voltage VPP that is higher than the first external power supply voltage VDD1. The first internal power supply voltage VPP may be referred to as a high voltage VPP that is a boosted voltage. The high voltage VPP may be provided to the row decoder 114 and may be used as a word line driving voltage of the memory cell array 111.

In addition, the first voltage generator 300 may generate a second internal power supply voltage VEQ dropped from the first external power supply voltage VDD1. The second internal power supply voltage VEQ may be referred to as an equalizing voltage VEQ. The equalizing voltage VEQ may be used as a driving voltage of an equalization control signal PEQi for equalizing a bit line of the memory cell array 111 and a complementary bit line thereof with a bit line precharge voltage VBL before a sensing operation of the bit line sense amplifier 112. The equalizing voltage VEQ may have a voltage level between the first external power supply voltage VDD1 and the second external power supply voltage VDD2.

The second and third voltage generators 310 and 314 may generate second and third internal power supply voltages VINTA and VINT_CSL, respectively, which are dropped from the second external power supply voltage VDD2. The second internal power supply voltage VINTA may be provided to the memory cell array 111 and the bit line sense amplifier 112. The second internal power supply voltage VINTA may be used as a driving voltage of the bit line sense amplifier 112, or may be used as a cell plate voltage VCP of the memory cell array 111 or a source voltage of a bit line precharge voltage VBL. The third internal power supply voltage VINT_CSL may be provided to the column decoder 116 and may be used as a transistor gating voltage of a column selection circuit, which selects a bit line of the memory cell array 111, to stably secure the transmission of read data output from the bit line sense amplifier 112 and the transmission of write data to the memory cell array 111. The voltage level of the second internal power supply voltage VINTA and the voltage level of the third internal power supply voltage VINT_CSL may be the same as each other or different from each other.

The fourth to eighth voltage generators 320, 322, 324, 326, and 328 may generate internal power supply voltages VINT and VBB/VBB2 dropped from the third external power supply voltage VDD3. The internal power supply voltage VINT generated from the fourth voltage generator 320 may be provided to the pad block 130B, and may be used as an operating voltage of the data input and output buffers of the pad block 130B. The data input and output buffers may use the internal power supply voltage VINT and/or the second external power supply voltage VDD2 as the operating voltage.

The internal power supply voltage VINT generated from the fifth voltage generator 322 may be provided to the row decoder 114 and may be used as an operating voltage of the row decoder 114. The row decoder 114 may use the internal power supply voltage VINT and/or the second external power supply voltage VDD2 as the operating voltage of the row decoder 114.

The internal power supply voltage VBB/VBB2 generated from the sixth voltage generator 324 may have a negative voltage level and may be referred to as a back bias voltage VBB or VBB2. The back bias voltage VBB may be provided to the memory cell array 111, and thus may be used as a body bias of a cell transistor to prevent a leakage current of the cell transistor. The back bias voltage VBB2 may be used as a gate bias of the cell transistor during a standby operation of the memory device 100.

The internal power supply voltage VINT generated from the seventh voltage generator 326 may be provided to the column decoder 116 and may be used as an operating voltage of the column decoder 116. The column decoder 116 may use the internal power supply voltage VINT and/or the second external power supply voltage VDD2 as the operating voltage of the column decoder 116.

The internal power supply voltage VINT generated from the eighth voltage generator 328 may be provided to the peripheral circuit block 120 and may be used as an operating voltage of the peripheral circuit block 120. The control logic, the row address multiplexer, the column address latch, the input and output gating circuit, and the refresh address generator, which constitute the peripheral circuit block 120, may use the internal power supply voltage VINT and/or the second external power supply voltage VDD2 as the operating voltage thereof.

The internal power supply voltages VINT generated from the fourth, fifth, seventh, and eighth voltage generators 320, 322, 326, and 328 may have the same voltage level, and may have a voltage level that is lower than the second and third internal power supply voltages VINTA and VINT_CSL generated from the second and third voltage generators 310 and 314. In some embodiments, the internal power supply voltages VINT generated from the fourth, fifth, seventh, and eighth voltage generators 320, 322, 326, and 328 may have different voltage levels.

Figure 4:
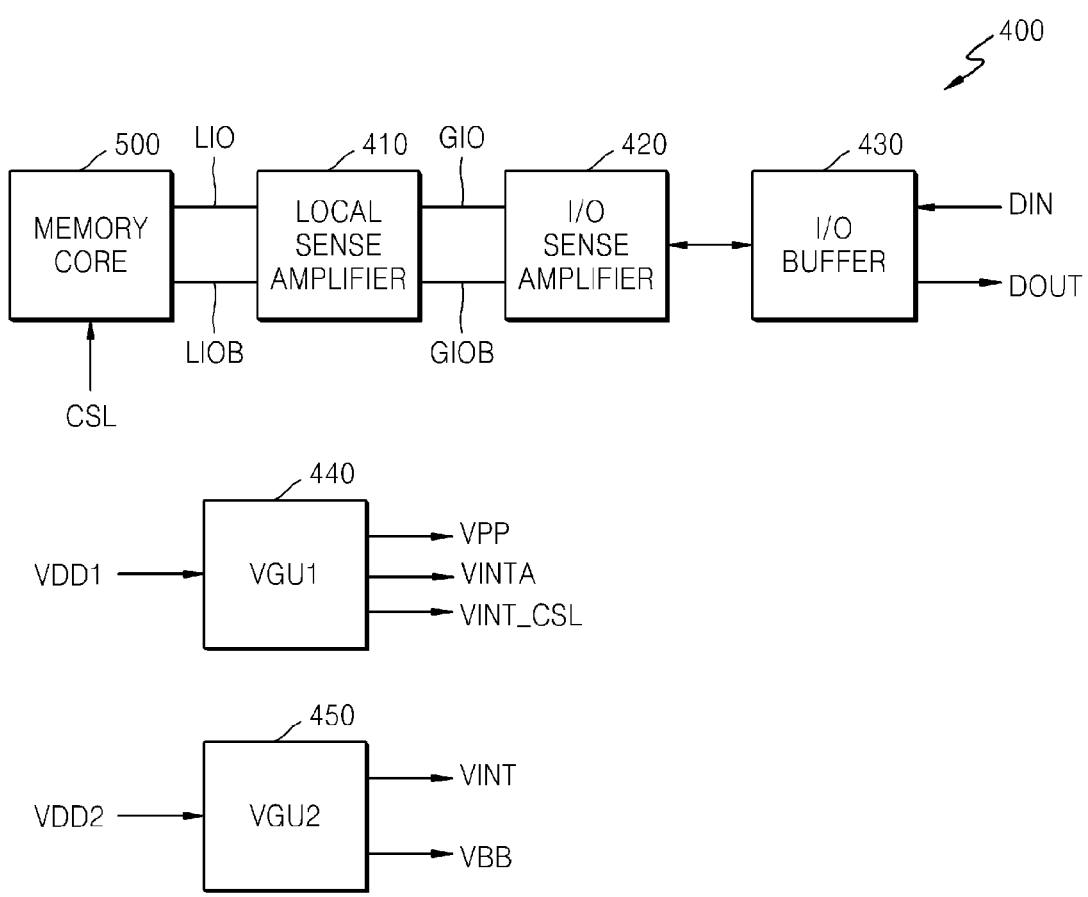
FIG. 4 is a diagram of a part of a memory device including voltage generators, according to an embodiment of the inventive concept.

FIG. 4 is a diagram of a part of a memory device 400 including voltage generators, according to an embodiment of the inventive concept.

Referring to FIG. 4, the memory device 400 includes a memory core 500, a local sense amplifier 410, an input and output sense amplifier 420, an input and output buffer 430, and first and second voltage generators 440 and 450.

The memory core 500 precharges a bit line BL of a memory cell array and a complementary bit line BLB thereof with a bit line precharge voltage VBL, amplifies a voltage difference between the bit line BL and the complementary bit line BLB, and provides an amplified voltage difference to a pair of local input and output lines LIO and LIOB in response to a column selection signal CSL. The local sense amplifier 410 amplifies a voltage difference between the pair of local input and output lines LIO and LIOB, and provides an amplified voltage difference to a pair of global input and output lines GIO and GIOB. The input and output sense amplifier 420 amplifies a voltage difference between the pair of global input and output lines GIO and GIOB. The input and output buffer 430 buffers an output of the input and output sense amplifier 420, and outputs the buffered output as output data DOUT. Alternatively, the input and output buffer 430 buffers input data DIN and provides the buffered input data to the input and output buffer 430. The output data DOUT of the input and output buffer 430 is provided to the outside of the memory device 400 through an output pad.

The first voltage generator 440 generates various first and third internal power supply voltages VPP, VINTA, and VINT_CSL by using the first external power supply voltage VDD1. The first internal power supply voltage VPP may be used as a boosted voltage for driving a word line of the memory cell array 111. The first internal power supply voltage VINTA may be used as a driving voltage of a bit line sense amplifier in the memory core 500, a cell plate voltage of the memory cell array 111, or a source voltage of a bit line precharge voltage VBL. The third internal power supply voltage VINT_CSL may be used as a transistor gating voltage of a column selection circuit for selecting a bit line of the memory cell array 111, that is, a driving voltage of a column selection signal.

The second voltage generator 450 generates various second internal power supply voltages VINT and VBB by using the second external power supply voltage VDD2 that is lower than the first external power supply voltage VDD1. The second internal power supply voltage VINT is used as a driving voltage of a peripheral circuit block other than the memory core 500. For example, the second internal power supply voltage VINT is used as an operating voltage of the local sense amplifier 410, the input and output sense amplifier 420, and the input and output buffer 430. In addition, the second internal power supply voltage VINT is used as an operating voltage of various circuits of the memory device 400, i.e., a control logic, a row address multiplexer, a column address latch, an input and output gating circuit, and a refresh address generator. The second internal power supply voltage VBB may be used as a back bias voltage, i.e., a body bias voltage of a cell transistor of the memory cell array, or may be used as a gate bias voltage of the cell transistor during a standby operation of the memory device 400.

Figure 5:
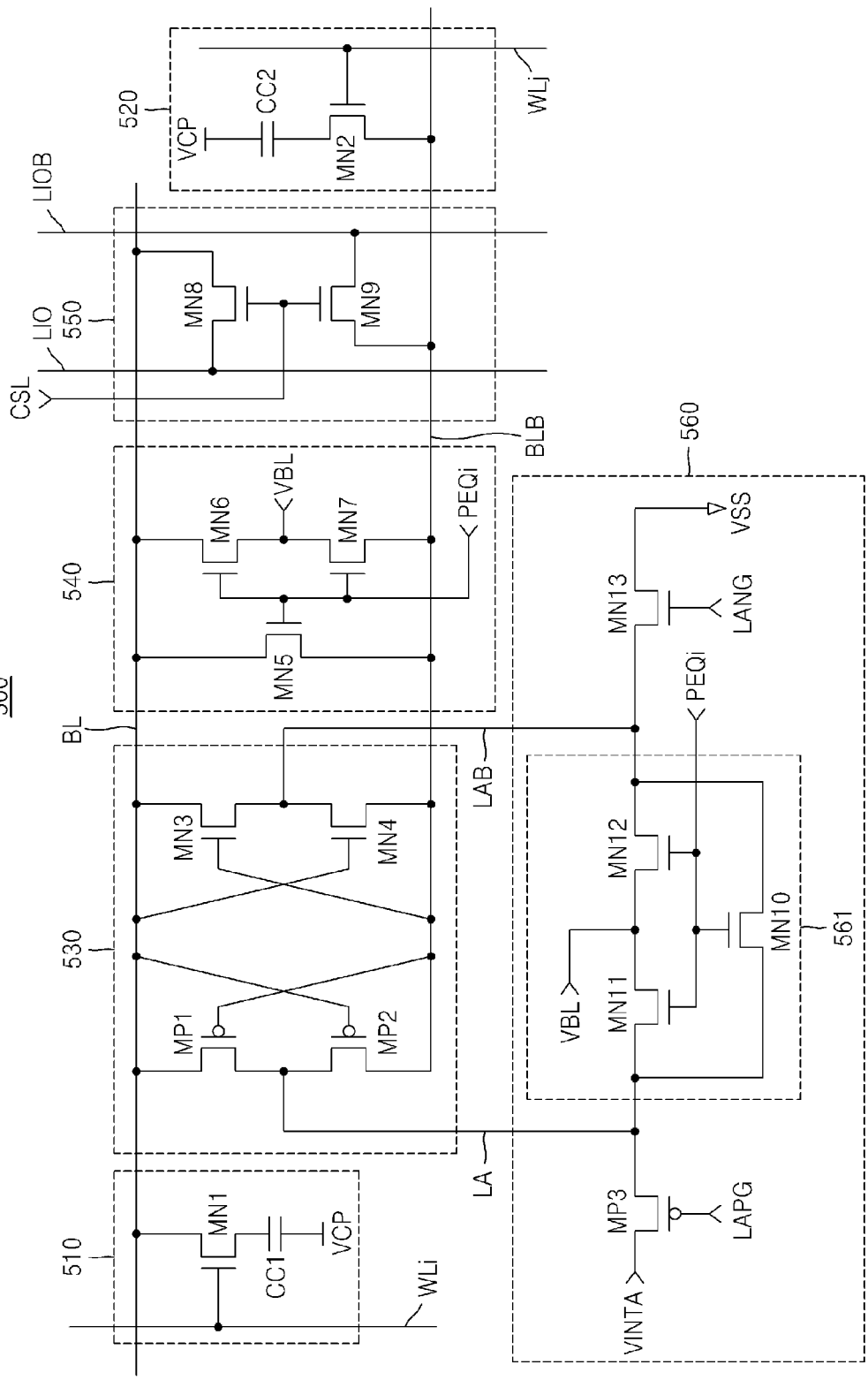
FIG. 5 is a circuit diagram illustrating a configuration of a memory core of FIG. 4, according to an embodiment of the inventive concept.

FIG. 5 is a circuit diagram illustrating an example of a configuration of the memory core 500 of FIG. 4, according to an embodiment of the inventive concept.

Referring to FIG. 5, the memory core 500 includes a first memory cell 510 connected to a bit line BL, a second memory cell 520 connected to a complementary bit line BLB, a bit line sense amplifier 530, a first equalizer 540, a column selection circuit 550, and an amplification control unit 560.

The first memory cell 510 includes a cell transistor MN1 and a cell capacitor CC1, which are connected in series. The second memory cell 520 includes a cell transistor MN2 and a cell capacitor CC2, which are connected in series. A cell plate voltage VCP is applied to one terminal of the cell capacitor CC1 and one terminal of the cell capacitor CC2. A drain of the cell transistor MN1 is connected to the bit line BL, and a gate of the cell transistor MN1 is connected to a word line WLi. A drain of the cell transistor MN2 is connected to the complementary bit line BLB, and a gate of the cell transistor MN2 is connected to a word line WLj.

The first equalizer 540 includes N-type metal oxide semiconductor (NMOS) transistors MN5, MN6, and MN7. The NMOS transistor MN5 is connected between the bit line BL and the complementary bit line BLB, and an equalization control signal PEQi is applied to a gate of the NMOS transistor MN5. A drain of the NMOS transistor MN6 is connected to the bit line BL, a bit line precharge voltage VBL is applied to a source of the NMOS transistor MN6, and the equalization control signal PEQi is applied to a gate of the NMOS transistor MN6. A drain of the NMOS transistor MN7 is connected to the complementary bit line BLB, the bit line precharge voltage VBL is applied to a source of the NMOS transistor MN7, and the equalization control signal PEQi is applied to a gate of the NMOS transistor MN7. The first equalizer 540 precharges the bit line BL and the complementary bit line BLB with the bit line precharge voltage VBL in response to the equalization control signal PEQi.

The bit line sense amplifier 530 includes P-type metal oxide semiconductor (PMOS) transistors MP1 and MP2, which are connected in series between the bit line BL and the complementary bit line BLB, and NMOS transistors MN3 and MN4, which are connected in series between the bit line BL and the complementary bit line BLB. The PMOS transistors MP1 and MP2 sense and amplify a voltage difference between the bit line BL and the complementary bit line BLB by using a power supply voltage VDD. The NMOS transistors MN3 and MN4 sense and amplify the voltage difference between the bit line BL and the complementary bit line BLB by using a ground voltage VSS.

The column selection circuit 550 includes NMOS transistors MN8 and MN9. The NMOS transistor MN8 electrically connects the bit line BL to a local input and output line LIO in response to a column selection signal CSL. The NMOS transistor MN9 electrically connects the complementary bit line BL to a complementary local input and output line LIOB in response to the column selection signal CSL.

The amplification control unit 560 includes a second equalizer 561, a PMOS transistor MP3, and an NMOS transistor MN13. The second equalizer 561 includes NMOS transistors MN10, MN11, and MN12. The equalization control signal PEQi is connected to gates of the NMOS transistors MN10, MN11, and MN12, and the bit line precharge voltage VBL is applied to sources of the NMOS transistors MN11 and MN12. The second equalizer 561 is connected to sources of the PMOS transistors MP1 and MP2 of the bit line sense amplifier 530 through a first power supply line LA, and is connected to sources of the NMOS transistors MN3 and MN4 of the bit line sense amplifier 530 through a second power supply line LAB. The second equalizer 561 precharges the first power supply line LA and the second power supply line LAB with the bit line precharge voltage VBL in response to the equalization control signal PEQi. The PMOS transistor MP3 provides the power supply voltage VDD to the bit line sense amplifier 530 through the first power supply line LA in response to a switch control signal LAPG. The NMOS transistor MN13 provides the ground voltage VSS to the bit line sense amplifier 530 through the second power supply line LAB in response to a switch control signal LANG.

When data stored in the cell capacitor CC1 is output to the bit line BL, a charge charging occurs between the capacitance of the cell capacitor CC1 and the capacitance of the bit line BL. Similarly, when data stored in the cell capacitor CC2 is output to the complementary bit line BLB, a charge sharing occurs between the capacitance of the cell capacitor CC2 and the capacitance of the complementary bit line BL. The bit line BL and the complementary bit line BLB are precharged with the bit line precharge voltage VBL in advance to efficiently sense data stored in the first and second memory cells 510 and 520.

Figure 6A:
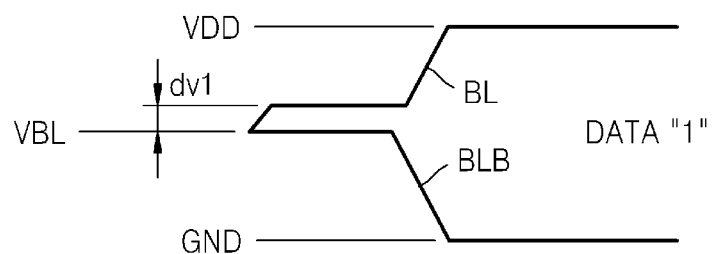
FIG. 6A is a diagram illustrating examples of voltage waveforms of a bit line and complementary bit line when sensing data "1" stored in a cell capacitor of FIG. 5.
Figure 6B:
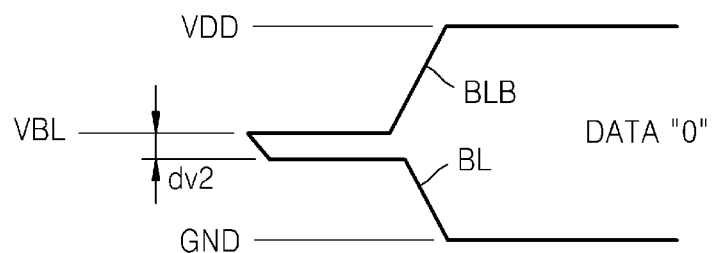
FIG. 6B is a diagram illustrating examples of voltage waveforms of the bit line and complementary bit line when sensing data "0" stored in the cell capacitor of FIG. 5.

FIG. 6A is a diagram illustrating examples of voltage waveforms of the bit line BL and complementary bit line BLB when sensing data "1" stored in the cell capacitor CC1 of FIG. 5, and FIG. 6B is a diagram illustrating examples of voltage waveforms of the bit line BL and complementary bit line BLB when sensing data "0" stored in the cell capacitor CC1 of FIG. 5.

Referring to FIG. 6A, after the bit line BL and the complementary bit line BLB are precharged with the bit line precharge voltage VBL in advance, the voltage level of the bit line BL increases by dV1 when the bit line sense amplifier 530 senses the data "1". When an amplification operation is completed by the bit line sense amplifier 530, the voltage level of the bit line BL becomes the level of the power supply voltage VDD, and the voltage level of the complementary bit line BLB becomes the level of the ground voltage VSS.

Referring to FIG. 6B, after the bit line BL and the complementary bit line BLB are precharged with the bit line precharge voltage VBL in advance, the voltage level of the bit line BL decreases by dV2 when the bit line sense amplifier 530 senses the data "0". When an amplification operation is completed by the bit line sense amplifier 530, the voltage level of the bit line BL becomes the level of the ground voltage VSS, and the voltage level of the complementary bit line BLB becomes the level of the power supply voltage VDD.

Figure 7:
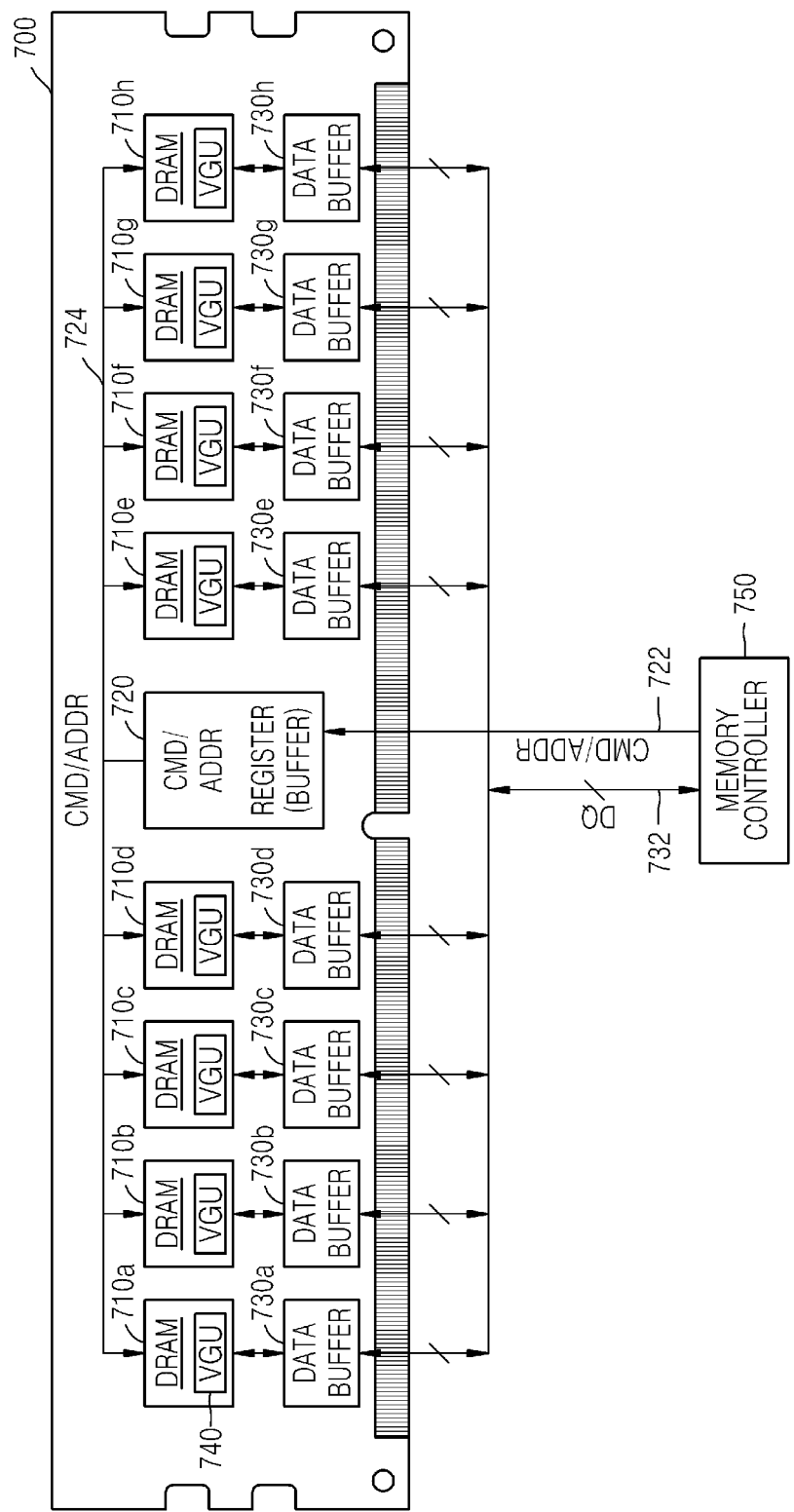
FIG. 7 is a diagram illustrating a memory module including memory chips each including voltage generators, according to an embodiment of the inventive concept.
Figure 8:
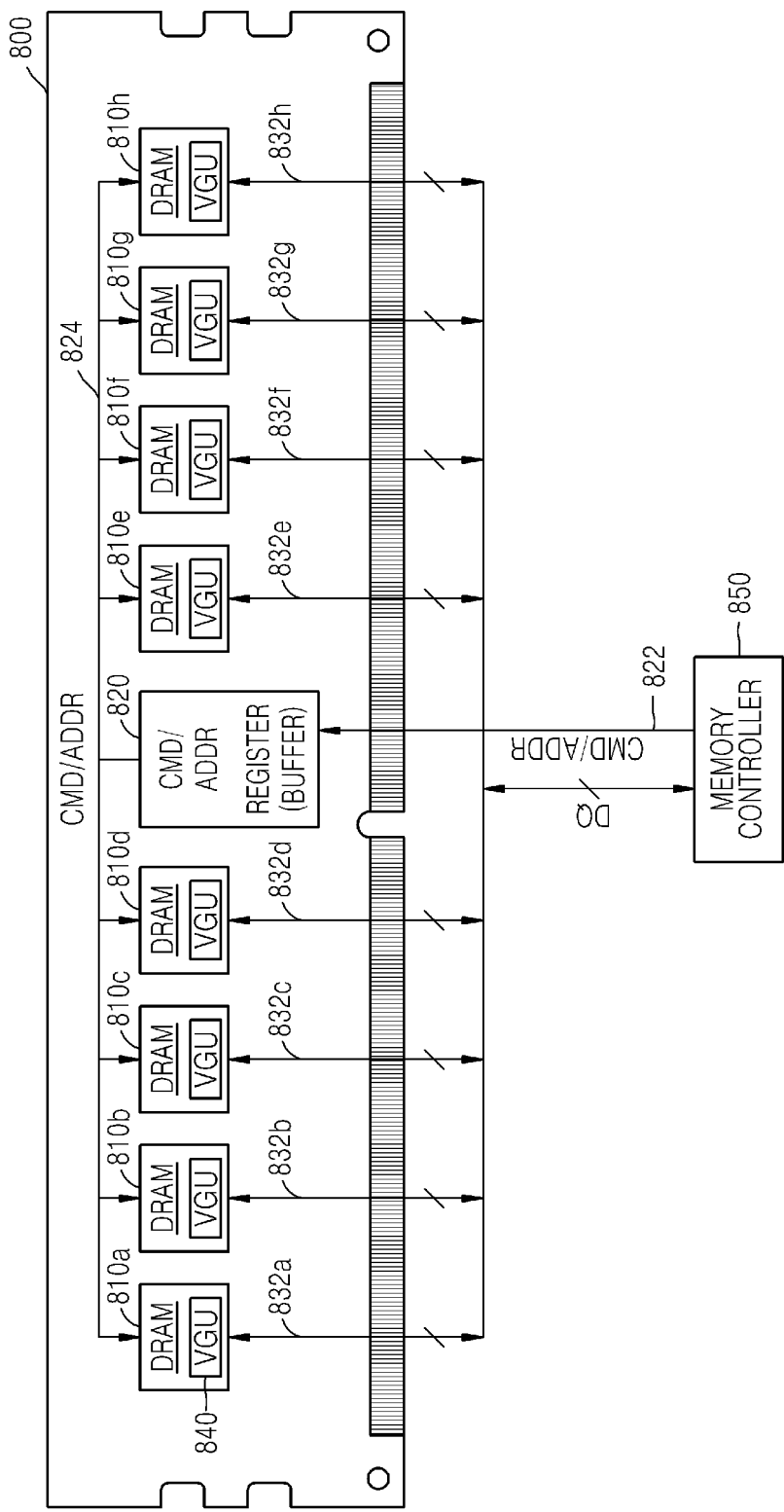
FIG. 8 is a diagram illustrating a memory module including memory chips each including voltage generators, according to another embodiment of the inventive concept.

FIG. 7 is a diagram illustrating a memory module 700 including memory chips according to an embodiment of the inventive concept, and FIG. 8 is a diagram illustrating a memory module 800 including memory chips according to another embodiment of the inventive concept. Each memory chip includes voltage generators.

Referring to FIG. 7, the memory module 700 includes a plurality of memory chips 710a-710h, a command/address register chip 720, and data buffer chips 730a-730h respectively connected to the memory chips 710a-710h. The command/address register chip 720 receives a command CMD and an address ADDR from a memory controller 750 via a control bus 722, and buffers and re-drives the command CMD and the address ADDR. The command CMD and the address ADDR output from the command/address register chip 720 may be provided to the memory chips 710a-710h via a first bus 724.

The data buffer chips 730a-730h may be connected to the memory chips 710a-710h, respectively. Each of the data buffer chips 730a-730h receives data DQ of a corresponding memory chip of the memory chips 710a-710h that is transmitted from the memory controller 750 via a data bus 732, buffers the data DQ, and transmits the buffered data to the corresponding memory chip of the memory chips 710a-710h. Also, each of the data buffer chips 730a-730h may transfer data received from a corresponding memory chip of the memory chips 710a-710h to the memory controller 750 via the data bus 732.

Each of the memory chips 710a-710h may include a voltage generation circuit block 740 according to an embodiment. The voltage generation circuit block 740 according to the embodiment may include a first voltage generator for generating a first internal power supply voltage based on a first external power supply voltage, and a second voltage generator for generating a second internal power supply voltage based on a second external power supply voltage that is lower than the first external power supply voltage. The first internal power supply voltage may be used as a driving voltage of a bit line sense amplifier in a core block including a memory cell array, and the second internal power supply voltage, which is lower than the first internal power supply voltage, may be used as a driving voltage of a peripheral circuit block other than the core block.

Each of the memory chips 710a-710h may include the voltage generation circuit block 740 according to another embodiment, and the voltage generation circuit block 740 according to another embodiment may include a first voltage generator for generating a first internal power supply voltage, which is higher than a first external power supply voltage, based on the first external power supply voltage, a second voltage generator for generating a second internal power supply voltage, which is lower than a second external power supply voltage, based on the second external power supply voltage which is lower than the first external power supply voltage, and a third voltage generator for generating a third internal power supply voltage, which is lower than the second internal power supply voltage, based on a third external power supply voltage which is lower than the second external power supply voltage. The first internal power supply voltage may be used as a high voltage, i.e., a boosted voltage, for driving a word line of a memory cell array, the second internal power supply voltage may be used as a driving voltage of a bit line sense amplifier in a core block including the memory cell array, and the third internal power supply voltage may be used as a driving voltage of a peripheral circuit block other than the core block.

Referring to FIG. 8, the memory module 800 includes a plurality of memory chips 810a-810h and a command/address register chip 820. The command/address register chip 820 receives a command CMD and an address ADDR from a memory controller 850 via a control bus 822, and buffers and re-drives the command CMD and the address ADDR. The command CMD and the address ADDR output from the command/address register chip 820 may be provided to the memory chips 810a-810h via a first bus 824.

Each of the memory chips 810a-810h may be connected to the memory controller 850 via data buses 832a-832h directly interconnected from the memory controller 850. Each of the memory chips 810a-810h may receive data DQ from the memory controller 850 via the data buses 832a-832h respectively connected to the memory controller 850. Data DQ that is output from each of the memory chips 810a-810h may be transferred to the memory controller 850 via the data buses 832a-832h.

Each of the memory chips 810a-810h may include a voltage generation circuit block 840 according to an embodiment. The voltage generation circuit block 840 according to the embodiment may include a first voltage generator for generating a first internal power supply voltage based on a first external power supply voltage, and a second voltage generator for generating a second internal power supply voltage based on a second external power supply voltage that is lower than the first external power supply voltage. The first internal power supply voltage may be used as a driving voltage of a bit line sense amplifier in a core block including a memory cell array, and the second internal power supply voltage, which is lower than the first internal power supply voltage, may be used as a driving voltage of a peripheral circuit block other than the core block.

Each of the memory chips 810a-810h may include a voltage generation circuit block 840 according to another embodiment. The voltage generation circuit block 840 according to another embodiment may include may include a first voltage generator for generating a first internal power supply voltage, which is higher than a first external power supply voltage, based on the first external power supply voltage, a second voltage generator for generating a second internal power supply voltage, which is lower than a second external power supply voltage, based on the second external power supply voltage which is lower than the first external power supply voltage, and a third voltage generator for generating a third internal power supply voltage, which is lower than the second internal power supply voltage, based on a third external power supply voltage which is lower than the second external power supply voltage. The first internal power supply voltage may be used as a high voltage, i.e., a boosted voltage, for driving a word line of a memory cell array, the second internal power supply voltage may be used as a driving voltage of a bit line sense amplifier in a core block including the memory cell array, and the third internal power supply voltage may be used as a driving voltage of a peripheral circuit block other than the core block.

Figure 9:
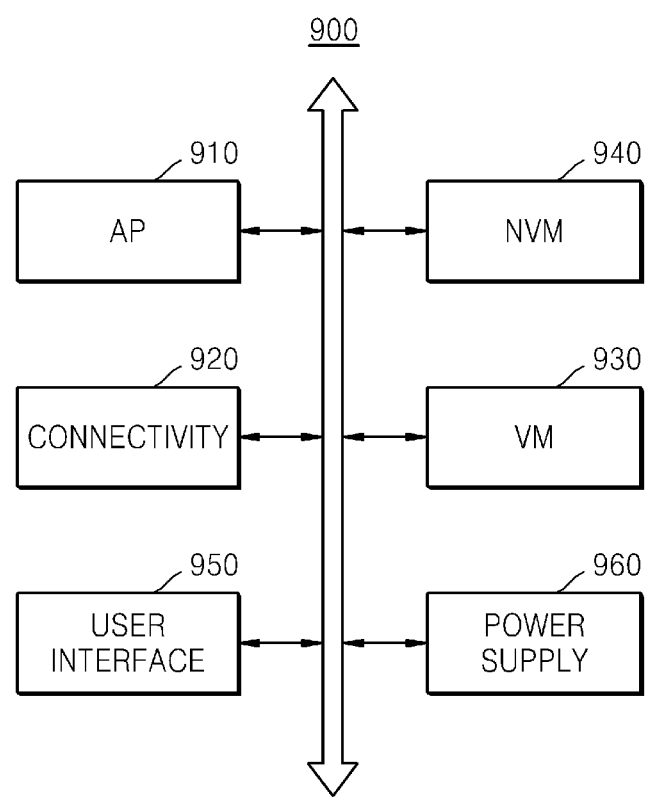
FIG. 9 is a block diagram of an example of applying a memory chip including voltage generators to a mobile system, according to an embodiment of the inventive concept.

FIG. 9 is a block diagram of an example of applying a memory chip including voltage generators to a mobile system 900, according to an embodiment of the inventive concept.

Referring to FIG. 9, the mobile system 900 may include an application processor 910, a connectivity unit 920, a volatile memory device 930, a nonvolatile memory device 940, a user interface 950, and a power supply 960. According to the present embodiment, the mobile system 900 may be an arbitrary mobile system, such as a mobile phone, a smartphone, a personal digital assistant (PDA), a portable multimedia player (PMP), a digital camera, a music player, a portable game console, or a navigation system.

The application processor 910 may execute applications providing an Internet browser, games, and moving pictures. According to the present embodiment, the application processor 910 may include a processor core (single core) or a plurality of processor cores (multi-core). For example, the application processor 910 may include a dual-core, a quad-core, or a hexa-core. Also, the application processor 910 may further include a cache memory located in or outside the application processor 910.

The connectivity unit 920 may communicate with an external device wirelessly or through a wire. For example, the connectivity unit 920 may perform Ethernet communication, near field communication (NFC), radio frequency identification (RFID) communication, mobile telecommunication, memory card communication, or universal serial bus (USB) communication. For example, the connectivity unit 920 may include a base band chipset and may support communication such as GSM, GRPS, WCDMA, and HSxPA.

The volatile memory device 930 may store data processed by the application processor 910, or may operate as a working memory. The volatile memory device 930 may be DRAM such as DDR SDRAM, LPDDR SDRAM, GDDR SDRAM, or RDRAM.

The volatile memory device 930 may include a first voltage generator for generating a first internal power supply voltage based on a first external power supply voltage, and a second voltage generator for generating a second internal power supply voltage based on a second external power supply voltage which is lower than the first external power supply voltage. The first internal power supply voltage may be used as a driving voltage of a bit line sense amplifier in a core block including a memory cell array, and the second internal power supply voltage, which is lower than the first internal power supply voltage, may be used as a driving voltage of a peripheral circuit block other than the core block.

Also, the volatile memory device 930 may include a first voltage generator for generating a first internal power supply voltage, which is higher than a first external power supply voltage, based on the first external power supply voltage, a second voltage generator for generating a second internal power supply voltage, which is lower than a second external power supply voltage, based on the second external power supply voltage which is lower than the first external power supply voltage, and a third voltage generator for generating a third internal power supply voltage, which is lower than the second internal power supply voltage, based on a third external power supply voltage which is lower than the second external power supply voltage. The first internal power supply voltage may be used as a high voltage, i.e., a boosted voltage, for driving a word line of a memory cell array, the second internal power supply voltage may be used as a driving voltage of a bit line sense amplifier in a core block including the memory cell array, and the third internal power supply voltage may be used as a driving voltage of a peripheral circuit block other than the core block.

The non-volatile memory device 940 may store a boot image for booting the mobile system 900. For example, the non-volatile memory device 940 may be electrically erasable programmable read-only memory (EEPROM), a flash memory, phase change random access memory (PRAM), resistance random access memory (RRAM), a nano floating gate memory (NFGM), polymer random access memory (PoRAM), magnetic random access memory (MRAM), ferroelectric random access memory (FRAM), or the like.

The user interface 950 may include one or more input devices such as a keypad and a touch screen, and/or a speaker, a display device, and one or more output devices. The power supply 960 may supply an operating voltage. Also, according to the present embodiment, the mobile system 900 may further include a camera image processor (CIP), and may further include a storage device such as a memory card, a solid state drive (SSD), a hard disk drive (HDD), and a CD-ROM.

The mobile system 900 or components of the mobile system 900 may be mounted in various types of packages, for example, package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat-pack (TQFP), small outline integrated circuit (SOIC), shrink small outline package (SSOP), thin small outline package (TSOP), thin quad flat-pack (TQFP), system in package (SIP), multi chip package (MCP), water-level fabricated package (WFP), and water-level processed stack package (WSP).

Figure 10:
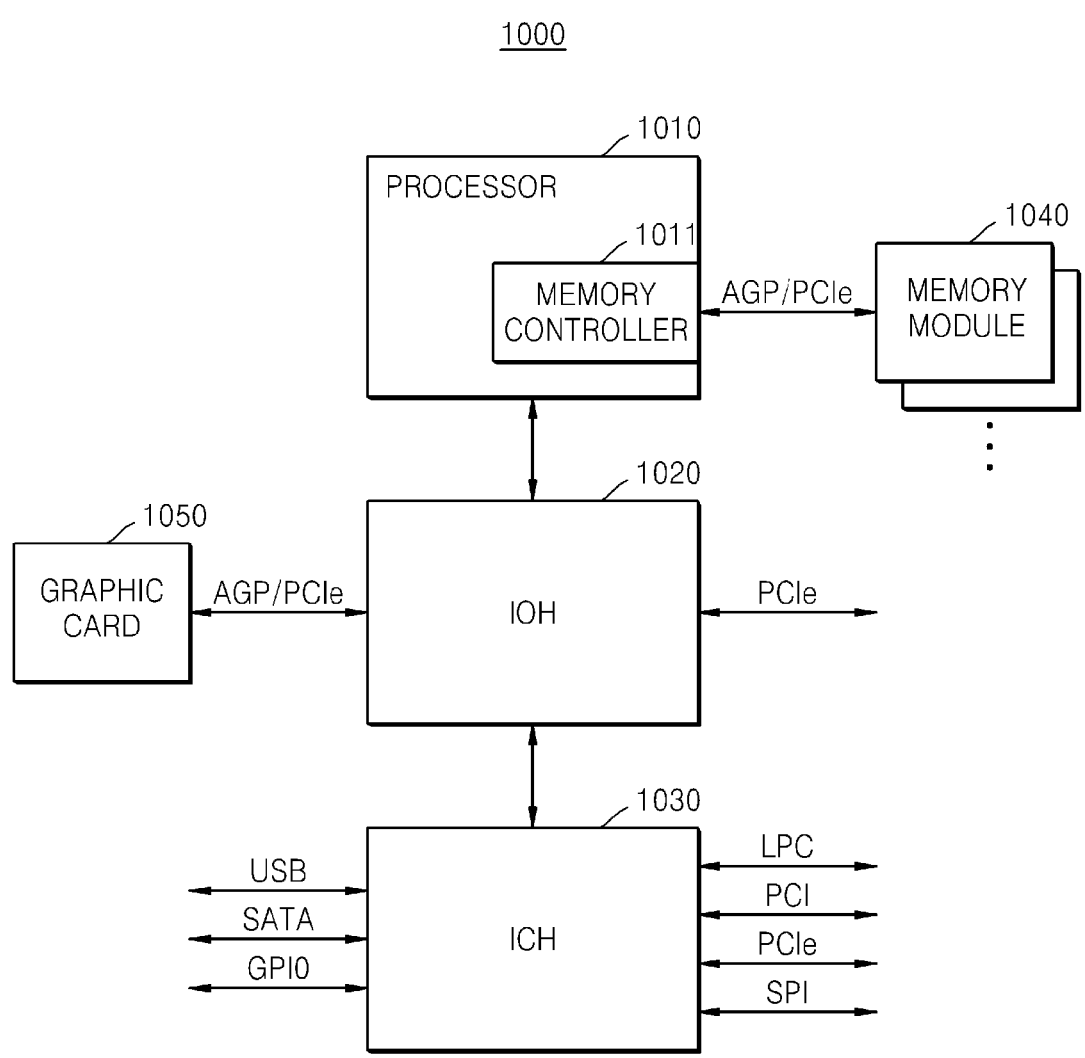
FIG. 10 is a block diagram of an example of applying a memory module mounted with a memory chip including voltage generators to a computing system, according to an embodiment of the inventive concept.

FIG. 10 is a block diagram of an example of applying a memory module mounted with a memory chip including voltage generators to a computing system 1000, according to an embodiment of the inventive concept.

Referring to FIG. 10, the computing system 1000 includes a processor 1010, an input/output hub 1020, an input/output controller hub 1030, at least one memory module 1040, and a graphic card 1050. According to the present embodiment, the computing system 1000 may be a computing system, such as a personal computer (PC), a server computer, a workstation, a laptop computer, a mobile phone, a smartphone, a PDA, a PMP, a digital camera, a digital TV, a set-top box, a music player, a portable game console, or a navigation system.

The processor 1010 may execute various computing functions such as certain calculations or tasks. For example, the processor 1010 may be a micro-processor or a CPU. According to the present embodiment, the processor 1010 may include a single core or a plurality of processor cores (multi-core). For example, the processor 1010 may include a dual-core, a quad-core, or a hexa-core. In addition, although the computing system 1000 in FIG. 10 includes one processor 1010, the computing system 1000 may include a plurality of processors. Also, the processor 1010 may further include a cache memory located in or outside the processor 1010.

The processor 1010 may include a memory controller 1011 for controlling operations of the memory module 1040. The memory controller 1011 included in the processor 1010 may be referred to as an integrated memory controller (IMC). A memory interface between the memory controller 1011 and the memory module 1040 may include one channel including a plurality of signal lines, or a plurality of channels. In addition, one or more memory modules 1040 may be connected to each of the channels. According to the present embodiment, the memory controller 1011 may be located in the input/output hub 1020. The input/output hub 1020 including the memory controller 1011 may be referred to as a memory controller hub (MCH).

The memory module 1040 may include a plurality of memory chips for storing data provided from the memory controller 1011 and a buffer chip. The memory chips may be DRAMS, such as DDR SDRAM, LPDDR SDRAM, GDDR SDRAM, or RDRAM.

Each of the memory chips may include a first voltage generator for generating a first internal power supply voltage based on a first external power supply voltage, and a second voltage generator for generating a second internal power supply voltage based on a second external power supply voltage which is lower than the first external power supply voltage. The first internal power supply voltage may be used as a driving voltage of a bit line sense amplifier in a core block including a memory cell array, and the second internal power supply voltage, which is lower than the first internal power supply voltage, may be used as a driving voltage of a peripheral circuit block other than the core block.

Also, each of the memory chips may include a first voltage generator for generating a first internal power supply voltage, which is higher than a first external power supply voltage, based on the first external power supply voltage, a second voltage generator for generating a second internal power supply voltage, which is lower than a second external power supply voltage, based on the second external power supply voltage which is lower than the first external power supply voltage, and a third voltage generator for generating a third internal power supply voltage, which is lower than the second internal power supply voltage, based on a third external power supply voltage which is lower than the second external power supply voltage. The first internal power supply voltage may be used as a high voltage, i.e., a boosted voltage, for driving a word line of a memory cell array, the second internal power supply voltage may be used as a driving voltage of a bit line sense amplifier in a core block including the memory cell array, and the third internal power supply voltage may be used as a driving voltage of a peripheral circuit block other than the core block.

The input/output hub 1020 may manage data transmission between the devices, such as the graphic card 1050, and the processor 1010. The input/output hub 1020 may be connected to the processor 1010 via various kinds of interfaces. For example, the input/output hub 1020 and the processor 1010 may be connected to each other via various interfaces, such as a front side bus (FSB), a system bus, a hypertransport, a lighting data transport (LDT), quickpath interconnect (QPI), a common system interface, and a peripheral component interface-express (CSI). Although the computing system 1000 of FIG. 10 includes one input/output hub 1020, the computing system 1000 may include a plurality of input/output hubs.

The input/output hub 1020 may provide various interfaces to the devices. For example, the input/output hub 1020 may provide an accelerated graphics port (AGP) interface, a peripheral component interface-expression (PCIe), a communications streaming architecture (CSA) interface, and the like.

The graphic card 1050 may be connected to the input/output hub 1020 via the AGP or the PCIe. The graphic card 1050 may control a display device (not shown) for displaying images. The graphic card 1050 may include an internal processor for processing image data, and an internal semiconductor memory. According to the present embodiment, the input/output hub 1020 may be connected to a graphic device via the graphic card 1050 disposed in the outside of the input/output hub 1020. However, in some other embodiments, the graphic device may be included in the inside of the input/output hub 1020. The graphic device included in the input/output hub 1020 may be referred to as integrated graphics. In addition, the input/output hub 1020 including the memory controller and the graphic device may be referred to as a graphic and memory controller hub (GMCH).

The input/output controller hub 1030 may perform data buffering and interface relay so that various system interfaces operate effectively. The input/output controller hub 1030 may be connected to the input/output hub 1020 via an internal bus. For example, the input/output hub 1020 and the input/output controller hub 1030 may be connected to each other via a direct media interface (DMI), a hub interface, an enterprise southbridge interface (ESI), or PCIe.

The input/output controller hub 1030 may provide various interfaces with peripheral devices. For example, the input/output controller hub 1030 may provide a universal serial bus (USB) port, a serial advanced technology attachment (SATA) port, a general purpose input/output (GPIO), a low pin count (LPC) bus, a serial peripheral interface (SPI), PCI, or PCIe.

According to the present embodiment, two or more components among the processor 1010, the input/output hub 1020, and the input/output controller hub 1030 may be implemented as one chipset.

While the inventive concept has been particularly shown and described with reference to exemplary embodiments thereof, it will be understood that various changes in form and details may be made therein without departing from the spirit and scope of the following claims.

What is claimed is:

1. A memory device comprising:
a first voltage generator configured to generate a first internal voltage based on a first power supply voltage;
a second voltage generator configured to generate a second internal voltage based on a second power supply voltage that is lower than the first power supply voltage; and
a core block including a memory cell array and a bit line sense amplifier configured to sense memory cell data in the memory cell array and amplify the sensed memory cell data,
wherein the first internal voltage is used as a driving voltage of the bit line sense amplifier in the core block, and
the second internal voltage that is lower than the first internal voltage is used as a driving voltage of a peripheral circuit block other than the core block.

2. The memory device of claim 1, wherein the first internal voltage is used as a cell plate voltage of the memory cell array or a source voltage of a bit line precharge voltage.

3. The memory device of claim 1, further comprising a column selection circuit configured to select a bit line of the memory cell array, and
wherein the first internal voltage is used as a transistor gating voltage of the column selection circuit.

4. The memory device of claim 1, further comprising a pad block that includes data input and output buffers, and
wherein the second internal voltage is used as an operating voltage of the data input and output buffers of the pad block.

5. The memory device of claim 1, wherein the peripheral circuit block includes a control logic, a row address multiplexer, a column address latch, an input and output gating circuit and a refresh address generator, and
the second internal voltage is used as an operating voltage of the control logic, the row address multiplexer, the column address latch, the input and output gating circuit and the refresh address generator.

6. The memory device of claim 1, further comprising a third voltage generator configured to generate a boosted voltage for driving a word line of the memory cell array based on the first power supply voltage, the boosted voltage being higher than the first power supply voltage.

7. The memory device of claim 1, further comprising a fourth voltage generator configured to generate a back bias voltage based on the second power supply voltage, the back bias voltage being used as a body bias of a cell transistor of the memory cell array, the back bias voltage having a negative voltage level.

8. The memory device of claim 7, wherein the back bias voltage is used as a gate bias of the cell transistor during a standby operation of the memory device.

9. A memory device comprising:
a first voltage generator configured to generate a first internal voltage based on a first power supply voltage, the first internal voltage being higher than the first power supply voltage;
a second voltage generator configured to generate a second internal voltage based on a second power supply voltage, the second internal voltage being lower than the second power supply voltage, the second power supply voltage being lower than the first power supply voltage;
a third voltage generator configured to generate a third internal voltage based on a third power supply voltage, the third internal voltage being lower than the second internal voltage, the third power supply voltage being lower than the second power supply voltage; and
a core block including a memory cell array and a bit line sense amplifier configured to sense memory cell data in the memory cell array and amplify the sensed memory cell data,
wherein the first internal voltage is used as a boosted voltage for driving a word line of the memory cell array,
the second internal voltage is used as a driving voltage of the bit line sense amplifier in the core block, and
the third internal voltage is used as a driving voltage of a peripheral circuit block other than the core block.

10. The memory device of claim 9, wherein the second internal voltage is used as a cell plate voltage of the memory cell array or a source voltage of a bit line precharge voltage.

11. The memory device of claim 9, further comprising a column selection circuit configured to select a bit line of the memory cell array, and
wherein the second internal voltage is used as a transistor gating voltage of the column selection circuit.

12. The memory device of claim 9, further comprising a pad block that includes data input and output buffers, and
wherein the third internal voltage is used as an operating voltage of the data input and output buffers of the pad block.

13. The memory device of claim 9, wherein the core block includes a row decoder configured to decode a row address and a column decoder configured to decode a column address.

14. The memory device of claim 9, further comprising a fourth voltage generator configured to generate a back bias voltage based on the third power supply voltage, the back bias voltage being used as a body bias of a cell transistor of the memory cell array, the back bias voltage having a negative voltage level.

15. The memory device of claim 14, wherein the back bias voltage is used as a gate bias of the cell transistor during a standby operation of the memory device.

16. A mobile system comprising:
an application processor;
a user interface;
a power supply; and
a memory device including a memory cell array, a core block and a voltage generator, the memory cell array including a plurality of memory cells, the core block including one or more bit line sense amplifiers configured to sense data stored in the plurality of memory cells, the voltage generator configured to generate a first internal voltage based on a first external power supply and a second internal voltage based on a second external power supply,
wherein the voltage generator is configured to provide the first internal voltage to the one or more bit line sense amplifiers, and provide the second internal voltage to a peripheral circuit block, the second internal voltage being lower than the first internal voltage.

17. The mobile system of claim 16, further comprising a nonvolatile memory device configured to store a boot image for booting the mobile system.

18. The mobile system of claim 16, wherein the memory device is a volatile memory device.

19. The mobile system of claim 16, further comprising a connectivity unit configured to communicate with an external device.

20. The mobile system of claim 16, wherein the first internal voltage is used as a boosted voltage for driving a word line of a memory cell array, and
the second internal voltage is used as a driving voltage of the one or more bit line sense amplifiers.

* * * * *